United States Patent
Mensch et al.

(10) Patent No.: US 6,421,248 B1
(45) Date of Patent: Jul. 16, 2002

(54) CHIP CARD MODULE

(75) Inventors: Hans-Georg Mensch, Neunburg; Stefan Emmert, Teublitz; Detlef Houdeau, Langquaid, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/354,134

(22) Filed: Jul. 15, 1999

Related U.S. Application Data

(63) Continuation of application No. PCT/DE97/02701, filed on Nov. 18, 1997.

(30) Foreign Application Priority Data

Jan. 15, 1997 (DE) .......................................... 197 01 165

(51) Int. Cl.⁷ ................................................ H05K 1/18
(52) U.S. Cl. ........................ 361/760; 361/767; 361/777; 361/784; 257/672; 257/737; 257/738; 174/259; 228/180.1; 228/180.22
(58) Field of Search ................................. 361/760, 767, 361/777, 779, 784, 790, 768; 174/259, 260, 262–266; 257/666, 668, 672, 673, 676, 737, 738; 228/180.1, 180.22

(56) References Cited

U.S. PATENT DOCUMENTS

| | | | | |
|---|---|---|---|---|
| 5,124,192 A | * | 6/1992 | Kim et al. ................... 428/215 |
| 5,290,624 A | * | 3/1994 | Bujard ........................ 428/209 |
| 5,428,248 A | * | 6/1995 | Cha ............................ 257/676 |
| 5,489,059 A | * | 2/1996 | Rostoker et al. ............ 228/175 |
| 5,502,289 A | * | 3/1996 | Takiar et al. ................ 174/266 |
| 5,610,442 A | * | 3/1997 | Schneider et al. ........... 257/787 |
| 5,781,412 A | * | 7/1998 | De Sorgo .................... 361/704 |
| 5,804,882 A | * | 9/1998 | Tsukagoshi et al. ......... 257/783 |
| 5,839,188 A | * | 11/1998 | Pommer ....................... 29/830 |
| 5,912,316 A | * | 6/1999 | Nguyen et al. ............... 528/93 |
| 6,117,797 A | * | 9/2000 | Hembree ..................... 438/759 |

FOREIGN PATENT DOCUMENTS

| | | |
|---|---|---|
| DE | 10500925 A1 | 7/1996 |
| DE | 19511775 C1 | 10/1996 |
| EP | 0197847 A1 | 10/1986 |
| EP | 0688051 A1 | 12/1995 |
| EP | 0694871 A1 | 1/1996 |
| JP | 61-297191 | 12/1986 |
| JP | 4166396 | 6/1992 |
| JP | 4269598 | 9/1992 |
| JP | 6132462 | 5/1994 |
| JP | 6191184 | 7/1994 |

* cited by examiner

*Primary Examiner*—Darren Schuberg
*Assistant Examiner*—David Foster
(74) *Attorney, Agent, or Firm*—Laurence A. Greenberg; Werner H. Stemer; Ralph E. Locher

(57) ABSTRACT

A chip card module contains, in addition to conductor tracks and a chip carrier, one or more semiconductor chips and, if necessary, a stiffening frame. The semiconductor chip(s) and/or stiffening frame are attached with the aid of an adhesive, with which particles of a defined size are admixed as spacers. The adhesive in preferably a flexible adhesive, and the particles preferably are formed of a deformable material. The invention has the effect that the semiconductor chip(s) and/or stiffening frame are adhesively attached to the underlying surface at a defined, uniform distance. The flexible adhesive and the deformable particles adapt to deformations of the chip card module and thus prevent damage to the adhesively bonded mating surfaces.

20 Claims, 1 Drawing Sheet

CHIP CARD MODULE

CROSS-REFERENCE TO RELATED APPLICATION

This is a continuation of copending International Application PCT/DE97/02701, filed Nov. 18, 1997, which designated the United States.

BACKGROUND OF THE INVENTION

FIELD OF THE INVENTION

The invention relates to a chip card module in which one or more semiconductor chips and/or a stiffening frame are attached with the aid of a special adhesive. The adhesive is distinguished in that particles of a defined size are added to it as spacers.

Published, European Patent Application EP 0 688 051 A1 discloses a chip card module in which a chip is glued on a conductor track located there-below. The adhesive used for doing so contains particles of defined size and is electrically anisotropically conductive, which enables an electrical contacting between contact surfaces of the chip which are located in pairs opposite each other on the one hand, and the conductor track on the other hand.

In the case of chip card modules it is of particular importance that the semiconductor chip or chips contained in the module on the one hand are adhesively attached on an underlying surface with the smallest possible distance from it, in order to ensure a low overall height of the module. On the other hand, the adhesive layer must provide electrical insulation and be of a uniform thickness over the entire adhesive surface, in order to avoid deformations of the chip that could lead to it being damaged. It would be particularly advantageous if the adhesive layer could adapt to certain deformations of the module and absorb them to reduce the loading on the semiconductor chip. Moreover, semiconductor chips attached with a uniform distance from the underlying surface facilitate the subsequent processing steps, such as wire bonding, and increase the reliability of the finished chip cards.

The same applies correspondingly to stiffening frames, which are used in conjunction with the flexible carrier film and are adhesively attached to the carrier foil or to the conductor tracks. In the latter case, the stiffening frame has to be electrically insulated from the conductor track system without the overall height of the chip card modules being increased too much by the adhesive layer.

The solutions known hitherto have a number of disadvantages with respect to the problems referred to above.

SUMMARY OF THE INVENTION

It is accordingly an object of the invention to provide a chip card module which overcomes the above-mentioned disadvantages of the prior art devices of this general type, in which one or more semiconductor chips and/or a stiffening frame are adhesively attached on an underlying surface at a distance which is predetermined and substantially uniform over the entire adhesive surface, with the smallest possible thickness of the adhesive layer. The adhesive layer should, moreover, be able to absorb and compensate for deformations of the chip card module within certain limits, so that the possibility of damaging the semiconductor chips and the stiffening frames is reduced.

With the foregoing and other objects in view there is provided, in accordance with the invention, a chip card module, including:

at least one chip carrier;

at least one semiconductor chip;

a non-conductive adhesive having particles of a defined sized and formed of an electrically, non-conductive material admixed in the non-conductive adhesive, the non-conductive adhesive fixing the at least one semiconductor chip to the at least one chip carrier and the particles serving as spacers between the at least one semiconductor chip and the at least one chip carrier; and conductor tracks disposed on the at least one chip carrier.

The invention thus relates to a chip card module which contains at least one chip carrier, one or more semiconductor chips, conductor tracks and, if appropriate, a stiffening frame. The at least one semiconductor chip and/or the stiffening frame are attached with the aid of the electrically non-conductive adhesive, with which electrically non-conductive particles of defined size are admixed as spacers.

The particles of a certain size added to the adhesive allow the adhesive composition, which, according to the invention, is applied without an adhesive mask, to be compressed to a defined layer thickness. The defined layer thickness substantially corresponds to the diameter of the particles. It is expedient for all the particles to be of substantially the same size. With a uniform distribution of the particles in the adhesive, a uniform distance from the underlying surface is maintained over the entire adhesive surface when pressing the semiconductor chip or the stiffening frame onto the underlying surface onto which they are to be adhesively attached.

It is not a precondition of the invention for the particles to be of a substantially uniform size. Rather, it is sufficient if, in addition to a proportion of particles of smaller size, there is an adequate amount of particles of a size which corresponds to the desired distance between the semiconductor chip or the stiffening frame and the underlying surface, and that the particles are distributed uniformly in the adhesive.

As already indicated, the size of the particles is chosen to correspond to the desired distance between the item to be attached and the underlying surface. The particles are expediently of a spherical shape, and their diameter corresponds to the desired thickness of the adhesive layer. The particles contained in the adhesive not only facilitate the attaching of the semiconductor chips and the stiffening frame at a defined height and a uniform, small distance from the underlying surface, but also the metering of the adhesive. The metering may take place without an adhesive mask, and excess adhesive is pressed out at the sides of the semiconductor chip or the stiffening frame, without having to fear the formation of an irregular adhesive joint as a result.

A particle size suitable for the production of the chip card modules lies in the range of a particle diameter of from 4 to 40 $\mu$m and, in particular, of about 20 $\mu$m.

The particles may be produced from a hard, non-deformable material, such as glass or rigid plastic. The particles are preferably produced, however, from a deformable and, particularly, a reversibly deformable material, such as deformable plastic.

Hard particles in plastic have the disadvantage that they cannot adapt to deformations in the chip card module and in such cases lead to localized or point-wise pressure loads, which may damage the adhesively bonded mating surfaces.

In the case of semiconductor chips, the localized pressure loads may lead to cracks or even ruptures in the chip and consequently to the total failure of the chip card module. By using deformable fillers, deformations of the chip card module can be absorbed by the particles and the localized pressure loads on the mating surfaces can be lessened.

Plastic materials are suitable as deformable or reversibly deformable materials for the filler particles. Particularly suitable are small hollow beads of plastic which are deformable under pressure. The deformability of the particles should expediently not be so great that, when the semiconductor chip or the stiffening frame to be adhesively attached is pressed onto the underlying surface, there already occurs a permanent deformation of the particles and the particles can no longer perform their function as spacers.

To compensate for deformations in the chip card module which may lead to damage of the latter, it is advantageous furthermore to use as the adhesive a flexible adhesive. The flexible adhesive is capable of following deformations of the chip card module and of compensating for them to a certain extent and thus of reducing the loads on the semiconductor chip or the stiffening frame.

So-called "low stress" adhesives are suitable as the flexible adhesives. Low stress adhesives remain flexible after the thermal curing. Synthetic rubbers and, in particular, silicone adhesives may be mentioned by way of example. The invention is suitable in particular for use in chip card modules with a flexible carrier film, but may equally be used in chip card modules with stable lead frames, which usually are formed of metal. In addition, the invention may be used for attaching a stiffening frame on a system of conductor tracks; this configuration offers advantages over other configurations if the stiffening frame is punched and has a burr which is to be attached at a very small distance from the system of conductor tracks.

Other features which are considered as characteristic for the invention are set forth in the appended claims.

Although the invention is illustrated and described herein as embodied in a chip card module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
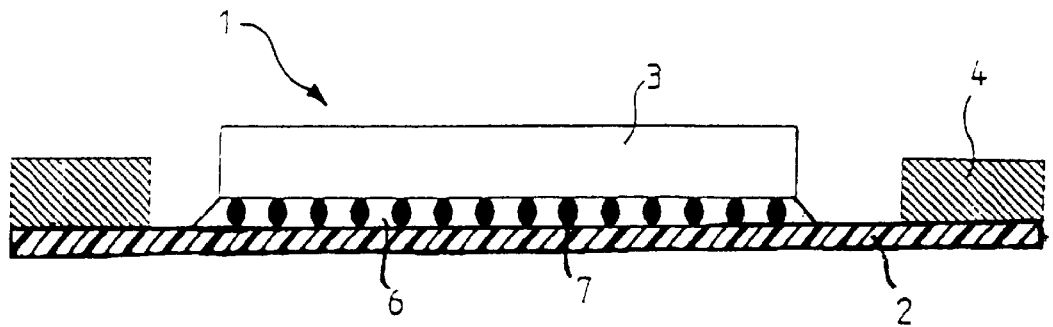
FIG. 1 is a diagrammatic, sectional view of a chip card module according to the invention.

In all the figures of the drawing, sub-features and integral parts that correspond to one another bear the same reference symbol in each case. Referring now to the figures of the drawing in detail and first, particularly, to FIG. 1 thereof, there is shown in cross-section a chip card module 1 according to the invention, in which a semiconductor chip 3 is disposed on a carrier 2, in this case a plastic carrier film (a so-called chip-on-flex module). Also located on the carrier is a system of conductor tracks 4, with which the semiconductor chip 3 can be contacted in the customary way, for example by wire bonding. The attachment of the semiconductor chip 3 on the carrier 2 takes place with an electrically non-conductive adhesive 6, with which, according to the invention, electrically non-conductive particles 7 of a defined size are admixed. The particles 7 have the effect on the one hand that the desired distance between the chip 3 and the carrier 2 is maintained and on the other hand that the distance is constant over an entire bearing surface of the chip 3. As a result, a distance between then chip 3 and the carrier 2 can be kept very small. Moreover, the defined, exact position of the semiconductor chip 3 on the carrier 2 makes it easier to produce the wire contacts between the chip 3 and the conductor tracks 4.

Figure 2:
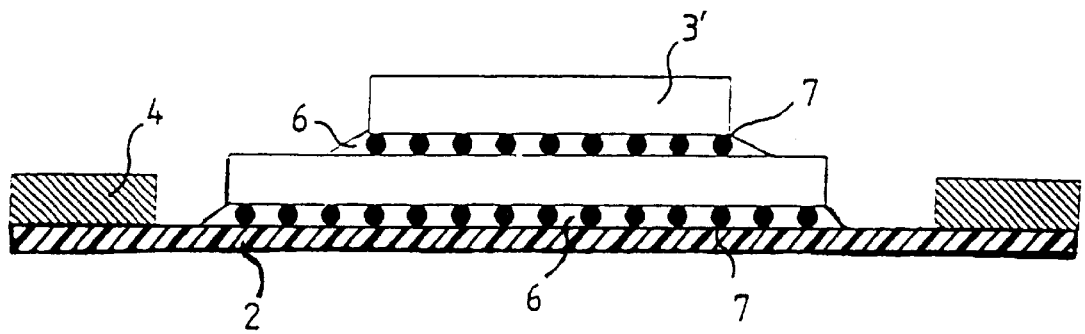
FIG. 2 is a sectional view through a further chip card module according to the invention.

FIG. 2 shows a so-called chip-on-chip module, a lower part of which substantially corresponds to the module shown in FIG. 1. Mounted on the first chip 3 is a second further chip 3'. The second chip 3' in also attached with the aid of the adhesive 6 filled with the particles 7 of defined size. In the case shown, the particles 7 are of the same size in both layers of the adhesive 6. However, both different adhesives and adhesives 6 with particles 7 of different sizes may be chosen for different levels of adhesive. To prevent damage to the chips 3 being caused by deformation of the chip card module, a flexible adhesive together with deformable particles, for example hollow plastic beads, is preferably chosen as the adhesive 6.

Figure 3:
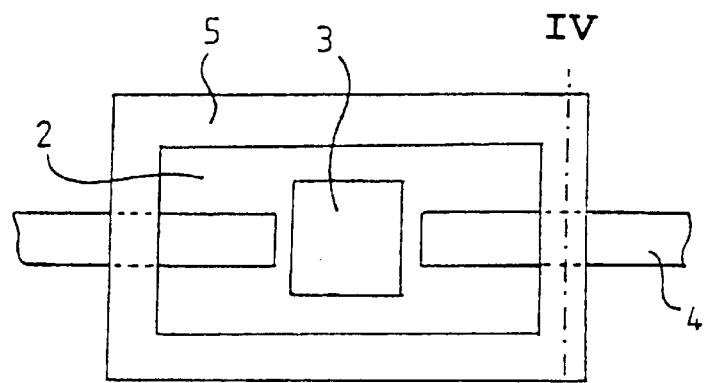
FIG. 3 is a plan view of the chip card module with a stiffening frame.

Represented in FIG. 3 is a chip card module with the semiconductor chip 3. The semiconductor chip 3 is attached on the flexible carrier tape 2, for example in the way described above. Running on both sides of the chip 3 are the conductor tracks 4. The conductor tracks 4 are contacted with the chip 3. In the module shown, metallization surfaces and conductor tracks 4 are present on both sides, above and beneath the carrier tape 2 (mounting side and contact side). For stabilization, such modules usually include a stiffening frame, which in FIG. 3 is denoted by the reference number 5. The frame 5 generally is formed of a conductive material and, in particular, of metal. It is usually produced by punching and therefore often has a burr on one side. To avoid short circuits between the stiffening frame 5 and the neighboring conductor tracks 4, the distance between the two must be greater than a height of the burr.

Figure 4:
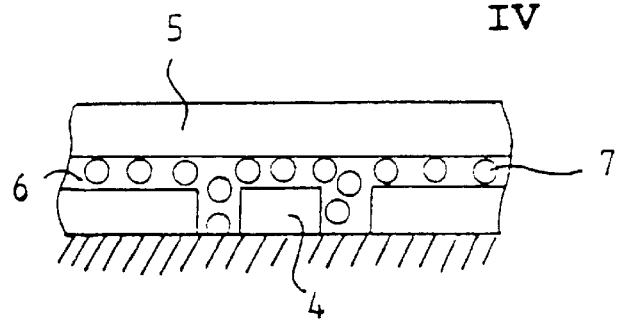
FIG. 4 is a fragmented, sectional view of the chip card module taken along the line IV—IV shown in FIG. 3.

This is achieved according to the invention by the adhesive 6, to which the particles 7 of defined size are added as spacers. FIG. 4 shows the corresponding configuration in cross-section along the line IV—IV shown in FIG. 3. The adhesive 6 is again preferably a flexible adhesive, the particles 7 are preferably deformable particles.

We claim:

1. A chip card module, comprising:
   at least one chip carrier;
   at least one semiconductor chip;
   a non-conductive adhesive having a thickness and particles of a defined size and diameter formed of an electrically non-conductive material admixed in said non-conductive adhesive, said non-conductive adhesive fixing said at least one semiconductor chip to said at least one chip carrier, said thickness substantially equaling said diameter, and said particles serving as spacers between said at least one semiconductor chip and said at least one chip carrier; and
   conductor tracks disposed on said at least one chip carrier.

2. The chip card module according to claim 1, wherein said non-conductive adhesive is a flexible adhesive, including a synthetic rubber and a silicone adhesive.

3. The chip card module according to claim 1, wherein said diameter is between 4 and 40 μm.

4. The chip card module according to claim 1, wherein said diameter is approximately 20 μm.

5. The chip card module according to claim 1, wherein said particles are formed of a deformable material including plastic.

6. The chip card module according to claim 5, wherein said particles are hollow plastic beads.

7. The chip card module according to claim 1, wherein said at least one chip carrier is selected from the group consisting of metallic lead frames and flexible carrier films.

8. A chip card module, comprising:

at least one chip carrier;

two semiconductor chips including a first chip and a second chip;

a non-conductive adhesive having particles of a defined size and formed of an electrically non-conductive material admixed in said non-conductive adhesive, said non-conductive adhesive fixing said first chip to said at least one chip carrier and said particles serving as spacers between said at least one semiconductor chip and said at least one chip carrier, said first chip adhesively attached to said second chip using said non-conductive adhesive admixed with said particles; and conductor tracks disposed on said at least one chip carrier.

9. The chip card module according to claim 1, including a stiffening frame adhesively attached to said conductor tracks using said non-conductive adhesive admixed with said particles.

10. A chip card module, comprising:

at least one chip carrier;

at least one semiconductor chip;

a non-conductive adhesive having particles of a defined size and formed of an electrically non-conductive material admixed in said non-conductive adhesive, said non-conductive adhesive fixing said at least one semiconductor chip to said at least one chip carrier and said particles serving as spacers between said at least one semiconductor chip and said at least one chip carrier;

conductor tracks disposed on said at least one chip carrier; and a stiffening frame adhesively attached to said conductor tracks using said non-conductive adhesive admixed with said particles, said stiffening frame having a burr with a height and said particles having a diameter greater than said height of said burr.

11. A chip card module, comprising:

at least one chip carrier;

at least one semiconductor chip disposed on said at least one chip carrier;

conductor tracks disposed on said at least one chip carrier;

a stiffening frame; and a non-conductive adhesive having a thickness and particles of a defined size and diameter formed of an electrically non-conductive material admixed in said non-conductive adhesive, said thickness substantially equaling said diameter, and said non-conductive adhesive fixing said stiffening frame to said at least one chip carrier and said particles serving as spacers between said stiffening frame and said at least one chip carrier.

12. The chip card module according to claim 11, wherein said non-conductive adhesive is a flexible adhesive, including a synthetic rubber and a silicone adhesive.

13. The chip card module according to claim 11, wherein said diameter is between 4 and 40 μm.

14. The chip card module according to claim 11, wherein said diameter is approximately 20 μm.

15. The chip card module according to claim 11, wherein said particles are formed of a deformable material including plastic.

16. The chip card module according to claim 15, wherein said particles are hollow plastic beads.

17. The chip card module according to claim 11, wherein said at least one chip carrier is selected from the group consisting of metallic lead frames and flexible carrier films.

18. A chip card module, comprising:

at least one chip carrier;

two semiconductor chips including a first chip and a second chip, said first chip disposed on said at least one chip carrier;

conductor tracks disposed on said at least one chip carrier;

a stiffening frame; and a non-conductive adhesive having particles of a defined size and formed of an electrically non-conductive material admixed in said non-conductive adhesive, said non-conductive adhesive fixing said stiffening frame to said at least one chip carrier and said particles serving as spacers between said stiffening frame and said at least one chip carrier, and said first chip adhesively attached to said second chip using said non-conductive adhesive admixed with said particles.

19. The chip card module according to claim 1, wherein said stiffening frame is adhesively attached to said conductor tracks using said non-conductive adhesive admixed with said particles.

20. The chip card module according to claim 19, wherein said stiffening frame has a burr with a height and said particles have a diameter greater than said height of said burr.

* * * * *